United States Patent
Iida et al.

(10) Patent No.: US 6,261,361 B1
(45) Date of Patent: Jul. 17, 2001

(54) SILICON SINGLE CRYSTAL WAFER HAVING FEW DEFECTS WHEREIN NITROGEN IS DOPED AND A METHOD FOR PRODUCING IT

(75) Inventors: Makoto Iida; Masaro Tamatsuka; Masanori Kimura; Shozo Muraoka, all of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/577,252

(22) Filed: May 19, 2000

Related U.S. Application Data

(62) Division of application No. 09/318,055, filed on May 25, 1999, now Pat. No. 6,077,343.

(30) Foreign Application Priority Data

Jun. 4, 1998 (JP) ................................................ 10-172273

(51) Int. Cl.[7] .................................................... C30B 15/04
(52) U.S. Cl. ................................ 117/19; 117/20; 117/30; 117/32; 117/917
(58) Field of Search ................................ 117/19, 20, 30, 117/32, 917

(56) References Cited

FOREIGN PATENT DOCUMENTS 8-330316 * 12/1996 (JP) .
11-147786 * 6/1999 (JP) .

OTHER PUBLICATIONS

Japan Journal of Applied Physics, Part 1 Regular Papers, Short Notes & Review Papers, Sep. 1993, vol. 32 No. 9A.*

* cited by examiner

Primary Examiner—Felisa Hiteshew
(74) Attorney, Agent, or Firm—Hogan & Hartson L.L.P.

(57) ABSTRACT

There is disclosed a method for producing a silicon single crystal wafer wherein a silicon single crystal is grown in accordance with the CZ method with doping nitrogen in an N-region in a defect distribution chart which shows a defect distribution in which the horizontal axis represents a radial distance D (mm) from the center of the crystal and the vertical axis represent a value of F/G ($mm^2/°$ C.·min), where F is a pulling rate (mm/min) of the single crystal, and G is an average intra-crystal temperature gradient(° C./mm) along the pulling direction within a temperature range of the melting point of silicon to 1400° C. There can be provided a method of producing a silicon single crystal wafer consisting of N-region where neither V-rich region nor I-rich region is present in the entire surface of the crystal by CZ method, under the condition that can be controlled easily in a wide range, in high yield, and in high productivity.

10 Claims, 4 Drawing Sheets

SILICON SINGLE CRYSTAL WAFER HAVING FEW DEFECTS WHEREIN NITROGEN IS DOPED AND A METHOD FOR PRODUCING IT

This is a continuation division of application Ser. No. 09/318,055 filed May 25, 1999 now U.S. Pat. No. 6,077,343, which application is hereby incorporated by reference in its entirety.

BACKGROUND OF THE INVENTION

1. Field of the Invention:

The present invention relates to a silicon single crystal wafer having few crystal defects in which nitrogen is doped, as well as to a method for producing such a silicon single crystal wafer.

2. Description of the Related Art:

Along with a decrease in size of semiconductor devices for achieving an increased degree of integration of semiconductor circuits such as DRAM, more severe quality requirements have recently been imposed on silicon single crystals which are grown by the Czochralski method (hereinafter referred to as the CZ method) for use as materials for substrates of semiconductor devices. Particularly, there has been required a reduction in density and size of grown-in defects such as flow pattern defects (FPDs), laser scattering tomography defects (LSTDs), and crystal originated particles (COPs), which are generated during the growth of a single crystal and degrade oxide dielectric breakdown voltage and characteristics of devices.

In connections with the above-mentioned defects incorporated into a silicon single crystal, first are described factors which determine the concentration of a point defect called a vacancy (hereinafter may be referred to as V) and the concentration of a point defect called an interstitial (hereinafter may be referred to as I).

In a silicon single crystal, a V region refers to a region which contains a relatively large number of vacancies, i.e., depressions, pits, voids or the like caused by missing silicon atoms; and an I region refers to a region which contains a relatively large number of dislocations caused by excess silicon atoms or a relatively large number of clusters of excess silicon atoms. Further, between the V region and the I region there exists a neutral (hereinafter may be referred to as N) region which contains no or few excess or missing silicon atoms. Recent studies have revealed that the above-mentioned grown-in defects such as FPDs, LSTDs, and COPs are generated only when vacancies and/or interstitials are present in a supersaturated state and that even when some atoms deviate from their ideal positions, they do not appear as a defect so long as vacancies and/or interstitials do not exceed the saturation level.

It has been confirmed that the concentration of vacancies and/or interstitials depends on the relation between the pulling rate (growth rate) of crystal in the CZ method and the temperature gradient G in the vicinity of a solid-liquid interface of a growing crystal, and that another type of defect called oxidation-induced stacking fault (OSF) is present in ring-shape distribution in the N-region between the V region and the I region.

The manner of generation of defects due to growth of a crystal changes depending on the growth rate. That is, when the growth rate is relatively high; e.g., about 0.6 mm/min or higher, grown-in defects such as FPDs, LSTDs, and COPs-which are believed to be generated due to voids at which vacancy-type points defects aggregate are present at a high density over the entire radial cross section of a crystal. The region where these defects are present is called a "V-rich region". When the growth rate is not greater than 0.6 mm/min, as the growth rate decreases the above-described OSF ring is generated from a Circumferential portion of the crystal. In such a case, L/D (large dislocation, simplified expression of interstitial dislocation loop) defects such as LSEPDs and LFPDs—which are believed to be generated due to dislocation loop—are present at a low density outside the OSF ring. The region where these defects are present is called an "I-rich region". Further, when the growth rate is decreased to about 0.4 mm/min, the above-described OSF ring converges (shrinks) to the center of a wafer and disappears, so that the I-rich region spreads over the entire cross section of the wafer.

Further, there has been recently found the existence of a region, called a N (neutral) region, which is located between the V-rich region and the I-rich region and outside the OSF ring and in which there exists neither defects of FPDS, LSTDs and COPs stemming from voids; defects of LSEPDs and LFPDs stemming from a dislocation loop; nor OSF. The region has been reported to be located outside the OSF ring, and substantially no oxygen precipitation occurs there when a single crystal is subjected to a heat treatment for oxygen precipitation and the contrast due to oxide precipitates is observed through use of an X-ray beam. Further, the N-region is on an I-rich region side, and is not rich enough to cause formation of LSEPDs and LFPDs.

It is confirmed that N-region is present also inside of the OSF ring, where neither defects due to vacancy, defects due to dislocation loop, nor OSF is present.

Since these N-regions are generally diagonal to a growing axis when the growing rate is decreased, they are present only in a part of the surface of the wafer.

As to the N-regions, Voronkov theory (V. V. Voronkov: Journal of Crystal Growth, vol. 59, p. 625–643, 1982) proposes that a total density of point defects depends on a value of F/G, which is a ratio of a pulling rate (F) to an intra-crystal temperature gradient along the pulling direction (G). According to the theory, the pulling rate must be constant in the surface and G is distributed in the surface. Therefore, at a certain pulling rate, there is obtained only a crystal having V-rich region in its center portion, I-rich region in the periphery of V-rich region, and N-rich region between the above two regions.

To solve the above-mentioned problem that N-region is present only diagonally, recently an improvement of distribution of G in the surface has been made. As a result, it has become possible to produce a crystal wherein N-region is expanded horizontally in the entire surface at a certain pulling rate, when the crystal is pulled with gradually lowering a pulling rate F. The region of the crystal where N-region is expanded in the entire surface can be enlarged axially to some extent, by pulling the crystal at a pulling rate at which N-region is expanded horizontally. Further, considering that G varies as the crystal grows, it has been proposed that the N-region can be expanded to some degree in the entire wafer surface along direction of growth when a ratio F/G is controlled to be constant by controlling a puling rate.

Meanwhile, it has been known that defects in FZ silicon is decreased in a silicon single crystal in which nitrogen is doped. Such method is also applied to CZ method, using the unique oxygen precipitation characteristics or the like.

However, for producing such a single crystal that the N-region having a very low defect density is expanded to the entire crystal, the pulling rate must be controlled minutely within an extremely narrow range, and the efficiency of furnace of apparatus for growing crystal (hot zone: HZ) is limited. Therefore, it has been difficult to expand the N-region to an axial direction of crystal.

Accordingly, the yield of the crystal wherein N-region is expanded to the entire crystal was low, and it was difficult to maintain the quality of crystal.

It has been believed that quality of a general CZ crystal (having V-rich region in its most surface) in which nitrogen is doped is good, since almost no grown-in defect is observed apparently. However, a detailed analysis revealed that there were a lot of small defects although aggregation of defect was suppressed by nitrogen doping. Besides, oxide dielectric breakdown voltage is not so good. Furthermore, when nitrogen is doped in high concentration to eliminate defects, there arise defects such as OSF due to oxygen precipitation caused by nitrogen in heat treatment in a device process or the like.

SUMMARY OF THE INVENTION

The present invention has been accomplished to solve the above-mentioned previous problems, and an object of the invention is to enable highly efficient production of a silicon single crystal wafer in accordance with the CZ method in a broad range of proper production conditions to be controlled easily, so that the silicon single crystal water has neither a V-rich region nor an I-rich region but has N-region with an extremely low defect density on the entire surface of the crystal.

To achieve the above-mentioned object, the present invention provides a silicon single crystal produced by Czochralski method wherein nitrogen is doped and the entire surface is occupied by N-region.

The present invention also provides a silicon single crystal produced by Czochralski method wherein nitrogen is doped, oxidation induced stacking fault is not caused by thermal oxidation treatment, and dislocation cluster is eliminated from all the surface of the wafer.

The concentration of doped nitrogen is preferably $5 \times 10^{11}$ atoms/cm$^3$ to $5 \times 10^{14}$ atoms/cm$^3$, because the concentration more than $5 \times 10^{14}$ atoms/cm$^3$ may cause adverse effect of nitrogen such as extraordinary oxygen precipitation by heat treatment of the wafer, and because the concentration of $5 \times 10^{11}$ atoms/cm$^3$ or more can increase the effect of nitrogen doping.

The present invention also provides a silicon single crystal wherein nitrogen is doped, a good chip yield in TZDB (Time Zero Dielectric Breakdown) and TDDB (Time Dependent Dielectric Breakdown) are both 90% or more, and a dislocation cluster is eliminated from all the surface of the wafer.

In the above description, "the good chip yield in TZDB and TDDB are 90% or more" means that the C-mode yield in TZDB and the γ-mode yield in TDDB are 90% or more.

Preferably, in the silicon single crystal wafer of the present invention, oxygen concentration is 13 to 16 ppma (-JEIDA (20.8 to 25.6 ppma-oldASTM)), and bulk defect density after heat treatment for gettering or the heat treatment for device fabrication is at least $5 \times 10^8$ number/cm$^3$ or more.

Namely, high gettering effect can be achieved even in a wafer having ordinary oxygen concentration.

"Gettering heat treatment" is a generic term for heat treatment conducted after the grown silicon single crystal ingot is processed to the wafer and before a device process. "Device heat treatment" is a generic term for heat treatment that is conducted in the device fabricating process, or a simulation heat treatment that is a simplified device heat treatment whether gettering heat treatment or other heat treatment is performed or not.

Preferably, nitrogen on the surface of the wafer is out-diffused by a heat treatment.

The present invention also provides a method for producing a silicon single crystal wafer wherein the silicon single crystal is grown by Czochralski method with doping nitrogen so that the entire surface of the crystal may become N-region.

As described above, when the crystal is pulled with doping nitrogen, N-region is much expanded, controllable range is wide, and control is easy, and therefore the silicon single crystal wafer can be produced in high yield.

The present invention also provide a method for producing such a silicon single crystal wafer that a silicon single crystal is grown in accordance with the CZ method in an N-region in a defect distribution chart which shows a defect distribution in which the horizontal axis represents a radial distance D (mm) from the center of the crystal and the vertical axis represent a value of F/G (mm$^2$/° C·min), where F is a pulling rate (mm/min) of the single crystal, and G is an average intra-crystal temperature gradient (° C./mm) along the pulling direction within a temperature range of the melting point of silicon to 1400° C.

When the pulling rate F of a single crystal and the average intra-crystal temperature gradient G along the pulling direction within a temperature range of the melting point of silicon to 1400° C. are controlled such that the single crystal is grown in a region located between a boundary between a V-rich region and an N-region and a boundary between the N-region and an I-rich region in the defect distribution chart (see FIG. 1) obtained through analysis of results of experiments and investigations, controllable range is wide, control is easy so that there can be produced a silicon single crystal wafer according to the present invention in high yield.

Namely, there can be easily produced the silicon single crystal wafer wherein nitrogen is doped and oxidation induced stacking fault is not caused on thermal oxidation treatment, and dislocation cluster is eliminated from all the surface of the wafer.

When the crystal is grown by CZ method, magnetic field may be applied thereto. In such so-called MCZ method, N-region can be further enlarged as a result of synergetic affect with nitrogen doping. Accordingly, when the crystal is pulled with applying magnetic field and doping nitrogen under the condition that N-region crystal can be grown, control range can be wide, and control can be performed easily, and therefore, the silicon single crystal wafer having extremely few defects can be easily produced in high productivity.

The concentration of doped nitrogen is preferably $5 \times 10^{11}$ atoms/cm$^3$ to $5 \times 10^{14}$ atoms/cm$^3$, because the concentration of nitrogen more than $5 \times 10^{14}$ atoms/cm$^3$ may cause adverse effect of nitrogen such as extraordinary oxygen precipitation when the wafer is subjected to heat treatment, and because the concentration of $5 \times 10^{11}$ atoms/cm$^3$ or more can increase effect of nitrogen doping.

One embodiment of the method of the present invention relates to a method of producing a silicon single crystal wafer wherein nitrogen on the surface of the silicon single crystal wafer obtained by the above-mentioned methods is out-diffused by a heat treatment.

If the above method is adopted, the adverse effect of nitrogen is suppressed, since there is no nitrogen near the surface of the wafer. Furthermore, there are very few crystal defects on the surface of the wafer, and nitrogen is contained in the bulk portion of the wafer. Therefore, oxygen precipitation is accelerated, and the wafer having sufficient IG effect (intrinsic gettering effect) can be produced.

The above-mentioned heat treatment is preferably conducted by a rapid heating/rapid cooling apparatus (hereinafter referred to as RTA (Rapid Thermal Anneler) apparatus occasionally). The apparatus is a single wafer type automatically continuous heat treatment apparatus, which can conduct heating and cooling for the heat treatment in a few seconds to a few hundred seconds. Hence, the wafer is not subjected to a harmful long period heat treatment, and an effective heat treatment can be performed for a short time as a few seconds to a few hundred seconds.

As described above, according to the present invention, the crystal is pulled with doping nitrogen, under the condition which makes it possible to produce N-region in the entire wafer, so that the range of the pulling rate for producing N-region can be enlarged, and the crystal having very few defects can be produced stably, in high yield, and in high productivity. Furthermore, the silicon single crystal wherein nitrogen is eliminated in the vicinity of the surface, and sufficient oxygen precipitation for gettering is caused by nitrogen in the bulk can be easily produced by subjecting the crystal to the heat treatment.

DESCRIPTION OF THE INVENTION AND EMBODIMENT

Figure 1:
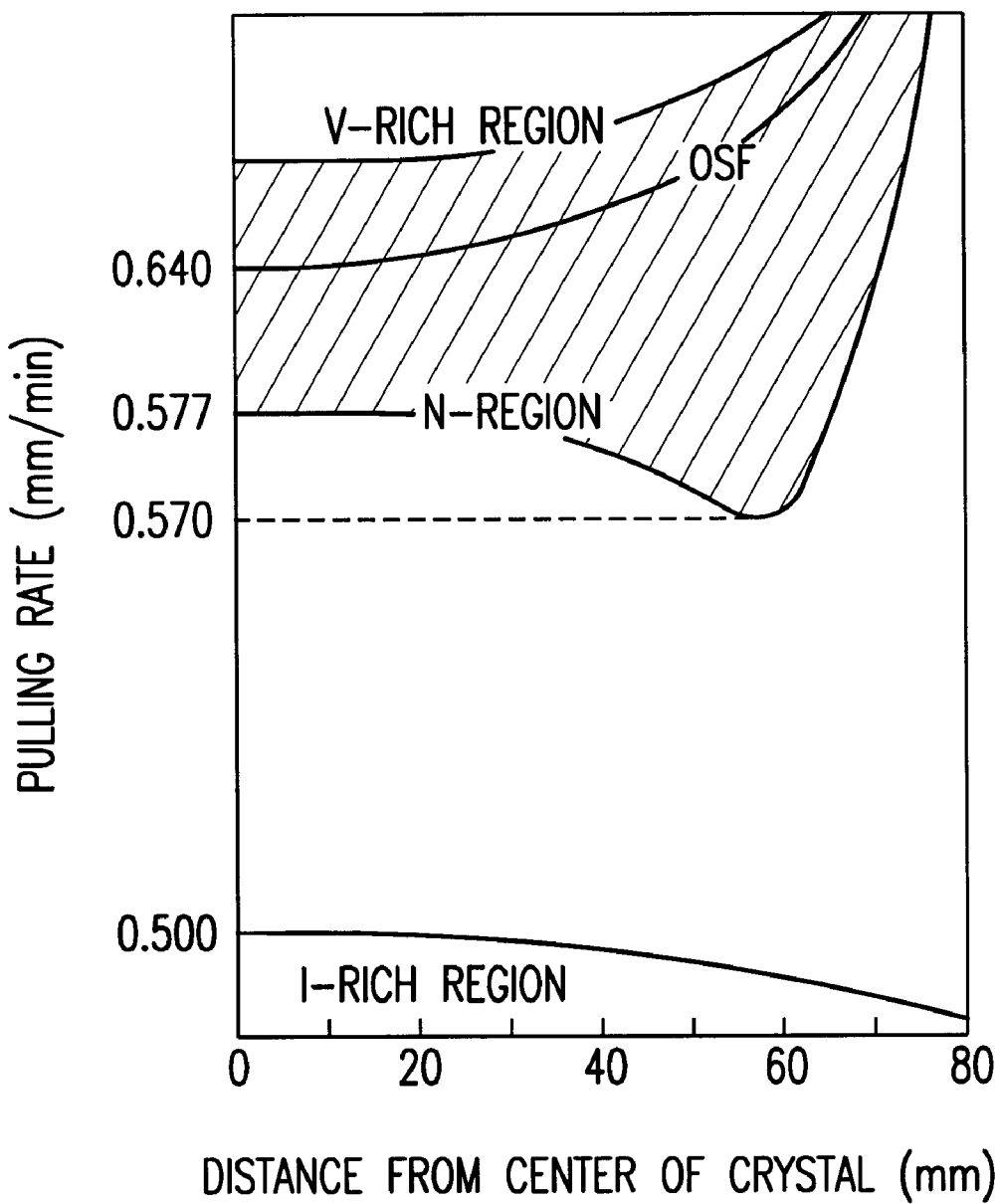
FIG. 1 shows a defect distribution chart in a silicon single crystal of the present invention wherein the horizontal axis is a position in a radial direction, and the vertical axis is an F/G value.

The present invention will now be described in detail, but the present invention is not limited thereto. First, terms appearing herein will be described.

1) FPD (Flow Pattern Defect) denotes flow patterns which, together with pits, are generated in the surface of a wafer which is sliced from a grown silicon single crystal ingot and treated by the steps of: removing a damaged layer from the surface portion of the wafer through etching with a mixed solution of hydrofluoric acid and nitric acid, and etching the wafer surface with a mixed solution of $K_2Cr_2O_7$, density in the wafer surface portion becomes higher, failure rate with regard to dielectric breakdown strength increase (Japanese patent Laid-Open (kokai) No, 4-192345)

2) SEPD (Secco Etch Pit Defect) denotes pits which are generated alone in the surface portion of a wafer which is Secco-etched in the same manner as in the case of FPD. Pits accompanied by flow patterns are generically referred to as FPD. Pits not accompanied by flow patterns are generically referred to as SEPD. SEPD having a size of 10 $\mu$m or more (LSEPD) conceivably derives from a dislocation cluster. When a dislocation cluster is present in a device, current leaks through the dislocation ; consequently, the function of a P-N junction is not effected.

3) LSTD (Laser Scattering Tomography Defect) denotes a defect existing in wafer, and the scattering light due to the defect can be detected in the following manner. That is, a wafer is sliced from a grown silicon single-crystal ingot, and is then treated by the steps of: removing a damaged layer from the surface portion of the wafer through with a mixed solution of hydrofluoric acid and nitric acid; and cleaving the wafer. When infrared light is introduced into the wafer through the cleavage plane, and light exiting from the wafer surface is detected, a scattering light due to the defects existing in a wafer can be detected. A scattering defect detected in this observation has already been reported at a meeting of an academic society or the like and is considered to be an oxide precipitate (J.J.A.P.vol. 32, p. 3679 1993). According to recent research, LSTD is reported to be an octahedral void.

4) COP(Crystal Originated Particle) denotes a defect which deteriorates the dielectric breakdown strength of oxide film at a central portion of a wafer and which is revealed as FPD in the case of treatment through Secco etching, but is revealed as COP in the case of cleaning in SC-1(cleaning by using a mixed aqueous solution of $NH_4OH:H_2O_2:H_2O=1:1:10$) which serves as a selective etchant. The pit has a diameter not greater than 1 $\mu$m and examined by a light scattering method.

5) L/D (Large Dislocation; simplified expression of interstitial dislocation loop) denotes defects, such as LSEPD and LFPD, which are considered to be generated due to a dislocation loop.

As described above, LSEPD reefers to SEPD having a size not less than 10 $\mu$m, while LFPD refers to FPD whose tip end has a size not less than 10 $\mu$m. These are also considered to be generated due to dislocation loops.

As described in Japanese Patent Application No, 9-199415, the inventors of the present invention in detail defects generated in the vicinity of a boundary between a V region and an I region of a silicon single crystal grown according to the CZ method and found that in the vicinity of the boundary there exists a very narrow neutral region in which the number of FPDs, LSTDs, and COPs is considerably low, and no LSEPDs exist.

Based on the above-described finding, the present inventors conceived that if N-region can be expanded to the entire cross section of a wafer, the number of point defects can be greatly decreased. That is, when the growth (pulling) rate of a single crystal and the temperature gradient therein are considered, the main factor that determines the distribution of point defects within the cross section is the temperature gradient, because the pulling rate is substantially constant throughout the cross section of the crystal. That is, the present inventors found that one problem is variation in the temperature gradient in the axial direction among different points within a cross section of the crystal and also found that if such variation can be decreased, the variation in the point defect density across the cross section can be decreased. Thus, the inventors of the present invention succeeded in obtaining a defect-free wafer whose entire surface is occupied by an N-region, through control of the intra-furnace temperature and adjustment of the pulling rate such that the difference $\Delta G$ between the temperature gradient Gc at the center of a crystal and the temperature gradient Ge at the circumferential portion of the crystal become 5° C./cm or less [$\Delta G=(Ge-Gc) \leq 5°$ C./cm]. However, in the method, it was difficult to expand the N-region to the axial direction of crystal, since the pulling rate must be controlled within a narrow range to produce N-region, and the structure of HZ was limited. Therefore, a growth rate needs to be lowered.

As for the influence of impurity to a grown-in defect distribution when light element impurity such as nitrogen or the like is doped, it has been reported that when boron is doped, a growing rate at which OSF ring is shrinked is increased a little, and a dislocation loop is hardly generated. It has also been reported that agglomeration of vacancies in the silicon is suppressed, and thus the crystal defect density is decreased, when nitrogen is doped in a silicon single crystal (T. Abe and H. Takeno, Mat. Res. Soc. Symp. Proc. Vol. 262, 3, 1992).

The inventors of the present invention investigated an influence of nitrogen doping in a crystal at various pulling rate, using a crystal pulling apparatus having HZ structure which can make a temperature gradient in a direction of a crystal axis, and can make a temperature gradient difference $\Delta G$ between the center part of the crystal and the periphery of the crystal as small as possible. As a result, they found the following facts and conditions for completing the present invention.

Namely, it has found that the margin of the puling rate at which a region in which neither FPD, COP, nor a dislocation cluster is present is enlarged by doping nitrogen. It has also been found that OSF is generated in a different way from that in the conventional method.

It was found by growing a crystal with doping nitrogen and varying the pulling rate, slicing samples at a cross section and a longitudinal section from the single crystal ingot thus obtained, measuring grown-in defect, and determining generation of OSF by performing a thermal oxidation treatment.

Figure 2:
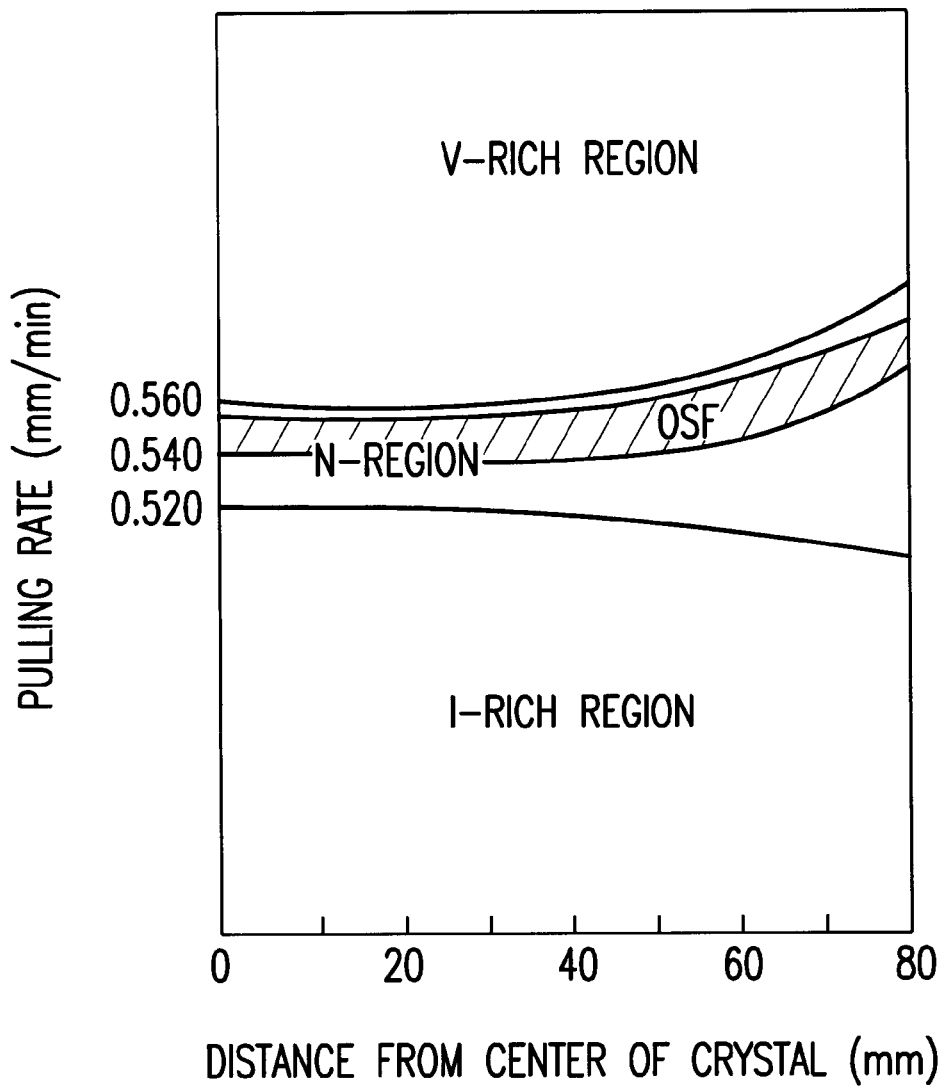
FIG. 2 shows a defect distribution chart in a crystal pulled by a conventional pulling method wherein the horizontal axis is a position in a radial direction, and the vertical axis is an F/G value.

FIG. 1 shows grown-in defects in the crystal when doping amount of nitrogen is $1 \times 10^{13}$ atoms/cm$^3$. FIG. 2 shows grown-in defects in the crystal produced using the same HZ as that used in the case of FIG. 1, without doping nitrogen.

As shown in FIG. 2, in the case that nitrogen was not doped, FPD was 0 at a pulling rate of 0.56 mm/min, and OSFs in a ring shape distribution were generated at a slightly lower pulling rate, and then OSFs were shrinked to be eliminated at the center at a pulling rate of 0.54 mm/min. Neither OSF, FPD nor dislocation cluster was present at a pulling rate lower than 0.54 mm/min, but dislocation clusters were generated at a pulling rate of 0.52 mm/min.

As shown in FIG. 1, in the case that nitrogen was doped at $1 \times 10^{13}$ atoms/$^3$, OSFs were generated in the entire surface in a radial direction at a higher pulling rate than the rate at which FPD was 0, and there was a region where FPDs, namely V-rich defects were generated, and OSFs were also generated. Furthermore, FPD was 0 and only OSFs existed in the region at a pulling rate of 0.640 mm/min, and OSFs were eliminated at the center but were present in the periphery at a pulling rate of 0.577 mm/min. At a pulling rate of 0.570 mm/min, OSFs in the periphery were eliminated, and neither OSF, FPD nor dislocation cluster was present. At 0.500 mm/min, a dislocation clusters were generated.

Namely, it was found that the region with no defect was enlarged, namely, generation and elimination of OSF was caused in a quite different manner from that in the case without doping nitrogen.

Converting it into F/G which has been previously reported, N-region with neither FPD nor dislocation cluster is generated at 0.146 to 0.157 mm$^2$/° C.·min in the case that nitrogen is not doped. The region with neither FPD, dislocation cluster nor OSF is generated in a very small range between 0.146 to 0.152 mm$^2$/°C·min. On the other hand, in the case that nitrogen is doped, N-region with neither FPD nor dislocation cluster is generated in a wide range of 0.141 to 0.180 mm$^2$/° C.·min. The region with neither FPD, dislocation cluster nor OSF is also enlarged as 0.141 to 0.61 mm$^2$/° C.·min.

Such a fact shows that the theory reported by Voronkov et al that distribution of defects depends on F/G, and a par where OSFs are generated, a boundary of FPD and a boundary of generation of dislocation clusters depend on a certain value of F/G cannot be used in the case that nitrogen is doped, and that variation of OSF is guite different from that previously reported as "OSF ring is shrinked as a pulling rate is decreased, and is eliminated a a certain value of F/G".

In this example, the margin of the pulling rate was only 0.04 mm/min (the margin for the region without OSF was 0.02 mm/min) when nitrogen was not doped, whereas the margin of the pulling rate was only 0.14 mm/min (the margin for the region without OSF was 0.07 mm/min) when nitrogen was doped. Therefore, there could be easily obtained a wafer having very few defects wherein all of OSF, FPD and dislocation cluster were eliminated from the entire surface of the wafer by growing a crystal at a pulling rate of 0.50 to 0.57 mm/min. Furtheremore, a wafer having N-region in its all surface can be produced at higher speed, so that productivity of the crystal can be improved.

In the present invention, a silicon single crystal ingot in which nitrogen is doped can be grown by CZ method according to a known method such as disclosed in, for example, Japanese Patent Application Laid-open (kokai) No 60-251190.

Namely, in CZ method comprising contacting a seed crystal with a melt of polycrystal silicon raw material contained in a quartz crucible, pulling it with rotating to grow a silicon single crystal ingot having an intended diameter, nitrogen can be doped in a silicon single crystal by placing nitride previously in the quartz crucible, adding nitride into the silicon melt, or by using an atmosphere gas containing nitrogen. A doping amount in the crystal can be controlled by controlling an amount of nitride, concentration or time of introduction of nitrogen gas.

As described above, crystal defects incorporated during growth of crystal can be suppressed by doping nitrogen when a single crystal ingot is grown by CZ method.

Whether or not nitrogen is doped, the temperature gradient of crystal changes as the crystal grows, and thus a pulling rate for N-region having no defects as above changes gradually before forming the head part and the tail part of the crystal. As the above-mentioned data is for growth of the crystal around the central portion, the pulling rate for growth of the head portion of the crystal may be faster, and the pulling rate for growth of a tail portion may be slower. Thereby, the crystal having very few defects in the entire part of the crystal can be easily formed, so that yield can be improved, and quality control can be easily conducted.

In this case, a magnetic field can be applied when a crystal is grown by CZ method. According to such MCZ method, with an effect of doping nitrogen, the pulling rate is shifted to higher range, and N-region is significantly enlarged.

As a magnetic field applied to a silicon melt, a horizontal magnetic field, a vertical magnetic field, a cusp magnetic field or the like is used. A magnetic field having a strength of 2000 G or more, preferably 3000 G or more may be applied, since a magnetic field less than 2000 G can achieve too small effect of the application of magnetic field.

Accordingly, when a crystal is pulled with applying a magnetic field and doping nitrogen under condition for producing an N-region crystal, a controllable range will be broader, control will be easier, so that a silicon single crystal wafer having very few crystal defects will be produced quite easily in high productivity.

In the present invention, a doping amount of nitrogen of $5\times10^{11}$ atoms/cm$^3$ or more can achieve a particularly large effect, and can enlarge a range of N-region significantly. For example, when nitrogen is doped at $1\times10^{14}$ atoms/cm$^3$, the above-mentioned effect is accelerated. As nirogen concentration increases, the effect of enlarging N-region gets large. However, when nitrogen concentration is more than $5\times10^{14}$ atoms/cm$^3$, extraordinary oxygen precipitation or the like may be caused when the wafer is subjected to a heat treatment. Accordingly, nitrogen concentration is preferably in the range of $5\times10^{11}$ atoms/cm$^3$ to $5\times10^{14}$ atoms/cm$^3$.

Namely, the above-mentioned F/G value is for the case that nitrogen is doped at $1\times10^{13}$ atoms/cm$^3$. F/G value varies depending on the doping amount of nitrogen, and can be determined experimentally.

As described above, there can be produced a silicon single crystal wafer of the present invention, namely a silicon single crystal wafer wherein nitrogen is doped, and the entire surface is occupied by N-region, or a silicon single crystal wafer wherein nitrogen is doped and oxidation induced stacking fault is not caused on thermal oxidation treatment, and dislocation cluster is eliminated from all the surface of the wafer.

In that case, excess nitrogen in the crystal may be removed by out-diffusing nitrogen on the surface of the wafer by subjecting the silicon single crystal produced with doping nitrogen to a heat treatment. Thereby, the wafer having very few defects on the surface can be obtained. Since nitrogen is present in the bulk portion of the wafer, oxygen precipitation is accelerated, and the wafer having sufficient IG effect (intrinsic gettering effect) can be produced.

Generally, N-region of a silicon single crystal include N (V) region where vacancy is rather dominant and N (I) region where interstitial silicon is rather dominant. Using a conventional silicon single crystal in which nitrogen is not doped, there may be produced a wafer in which N (v) region having gettering effect and N (I) region having no gettering effect intermingles at a usually adopted oxygen concentration. In the N (I) region in the case that nitrogen is not doped, crystal defects in the crystal after heat treatment of 800° C.×4 hours+1000° C.×16 hours was $1\times10^7$ to $1\times10^8$ number/cm$^3$, so that gettering effect is low in the entire wafer.

However, when nitrogen is doped, defects in the crystal (BMD: Bulk Micro Defect) after heat treatment of 800° C.×4 hours+1000° C.×16 hours was confirmed to be more than $1\times10^9$ number/cm$^3$ so that high gettering effect can be achieved in the entire N-region. Thereby, gettering effect in the entire wafer can be improved significantly.

The gettering effect of the wafer can be high even in the wafer having low oxygen concentration owing to nitrogen contained in the bulk portion. When oxygen concentration is 13 ppma (-JEIDA, (20.8 ppma-ASTM'79)) or more, gettering effect is higher.

The specific condition of heat treatment for out-diffusing nitrogen on the surface of the wafer may be a temperature of 900° C. to a melting point of silicon.

The heat treatment at the temperature in such a range makes it possible to out-diffuse nitrogen sufficiently, and also out-diffuse oxygen at the same time, so that generation of defects due to oxygen precipitation in the surface layer can be prevented almost completely.

In the bulk portion, oxide precipitates can be grown by the above heat treatment, so that the wafer having IG effect can be obtained. Particularly, according to the present invention oxygen precipitation is accelerated owing to presence of nitrogen, so that high IG effect can be achieved even in a silicon wafer having low oxygen concentration.

In that case, the heat treatment is preferably conducted with a rapid heating/rapid cooling apparatus. The apparatus is so-called RTA apparatus, which is a single-wafer type automatically continuous heat treatment apparatus, and makes it possible to conduct heating and cooling in several seconds to few hundred seconds, so that the wafer is not subjected to a harmful long heat treatment, and an effective heat treatment can be performed in a short time as a few seconds to a few hundred seconds.

Furthermore, the heat treatment is preferably in an atmosphere of oxygen, hydrogen, argon or a mixed atmosphere thereof.

The heat treatment in such an atmosphere makes it possible to efficiently out-diffuse nitrogen without forming a film which is harmful to the wafer. Particularly, the heat treatment in a reducing atmosphere such as hydrogen, argon or a mixed atmosphere thereof at high temperature is preferable, since it makes it possible to eliminate crystal defects on the surface of the wafer easily.

There can be thus obtained the silicon single crystal wafer of the present invention produced by CZ method with doping nitrogen wherein nitrogen on the surface of the silicon single crystal wafer is out-diffused by the heat treatment.

The silicon single crystal wafer of the present invention has very few defects on the surface thereof, and therefore, is excellent in electric characteristics such as oxide dielectric breakdown voltage or the like, so that yield can be improved in fabrication of a device.

Figure 3:
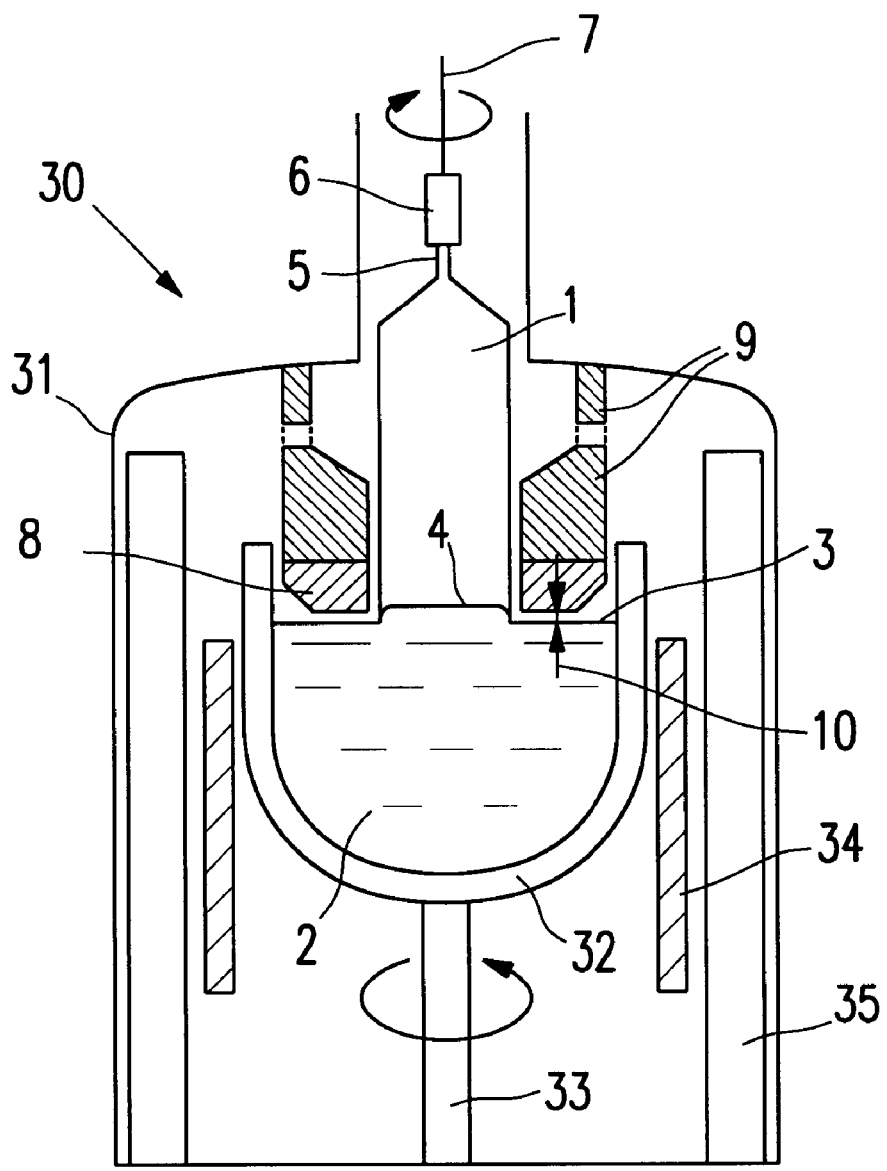
FIG. 3 is a schematic view showing the apparatus for pulling a single crystal used in the present invention.

The present invention and embodiments of the present invention will be described below with referring drawings. An example of constitution of an apparatus for pulling a single crystal used in the present invention is shown in FIG. 3. As shown in FIG. 3, the apparatus 30 for pulling crystal includes a pulling chamber 31, a crucible 32 provided in the pulling chamber 31, a heater 34 disposed around the crucible 32, a crucible-holding shaft 33 for rotating the crucible 32 and a rotation mechanism (not shown) therefor, a seed chuck 6 for holding a silicon seed crystal 5, a wire 7 for pulling the seed chuck 6, and a winding mechanism (not shown) for rotating and winding up the wire 7. The crucible 32 includes an inner quartz crucible for containing a silicon melt 2 and an outer graphite crucible located outside the quartz crucible. A heat insulating material 35 is disposed around the heater 34.

In order to establish operating conditions for the production method of the present invention, an annular solid-liquid interface insulator 8 is arranged around the solid-liquid interface of a single crystal, and an upper surrounding insulator 9 is disposed on the solid-liquid interface insulator 8. The solid-liquid interface insulator 8 is disposed such that a gap 10 of 3–5 cm is formed between the lower end of the insulator 8 and the surface of the silicon melt 2. The upper surrounding insulator 9 may be omitted depending on the conditions. Further, there is provided a tubular cooling device (not shown) for cooling the single crystal by jetting a cooling gas or by shutting off radiant heat.

Recently, a so-called MCZ method has often been employed. When the MCZ is employed, an unillustrated magnet is disposed outside the pull chamber 31 in a horizontal orientation so as to apply a magnetic field to the silicon melt 2 in a horizontal or vertical direction or in a like direction. Through the application of magnetic field to the silicon melt 2, convection of the melt 2 is suppressed to thereby stably grow a single crystal.

Next will be described a method for growing a single crystal of the present invention through use of the crystal pulling apparatus 30 mentioned above.

First, a high-purity polycrystalline material of silicon is heated to its melting point (approximately 1420° C.) or higher and is thus melted in the crucible 32. Then, for example, silicon wafers having silicon nitride film is dipped therein in order to dope nitrogen. Then, the wire 7 is released until a tip end of the seed crystal comes into contact with the surface of the melt 2 at an approximately central portion or is immersed therein. Subsequently, the crucible holding shaft 33 is rotated in an appropriate direction, and the wire 7 is wound up with being rotated at the same time to pull the seed crystal 5, and thereby growth of the crystal is initiated. Then, through adequate regulation of the pulling rate and temperature, a substantially cylindrical single crystal ingot 1 wherein nitrogen is doped can be obtained.

To achieve the objects of the present invention, the invention employs the following structural features. As shown in FIG. 3, the annular solid-liquid interface insulator 8 is disposed in the pull chamber 31 such that the solid-liquid interface insulator 8 surrounds the liquid portion of the single crystal 1; i.e., the temperature zone of 1420–1400° C. in the vicinity of the surface of the melt. In addition, the upper surrounding insulator 9 is disposed above the solid-liquid interface insulator 8. Further, if necessary, a device for cooling the crystal is disposed on the insulator in order to jet a cooling gas to the crystal from above. Moreover, a radiant heat reflecting plate may be attached to the lower portion of the cylinder.

As mentioned above, an insulator is arranged immediately above the surface of the melt with a predetermined gap formed therebetween, and a device for cooling the crystal is optionally disposed above the insulator. This structure yields a heat retention effect in the vicinity of the crystal growth interface due to the radiant heat and can cut the radiant heat from the heater or the like in the upper part of the crystal. As a result, the operating conditions for the production method of the present invention are established.

Subsequently, a silicon wafer is produced by slicing the above mentioned silicon single crystal ingot containing nitrogen and processing it. It is then subjected to a heat treatment to out-diffuse nitrogen on the surface of the wafer. In the present invention, the heat treatment was performed with a rapid heating/rapid cooling apparatus. Examples of RTA apparatus include a heater such as a lamp heater with heat radiating. An example of commercially available apparatuses is SHS-2800 manufactured by AST corporation. These apparatuses are neither extremely complicated nor expensive.

One example of RTA apparatus which can be used in the present invention will be described with reference to FIG. 4.

Figure 4:
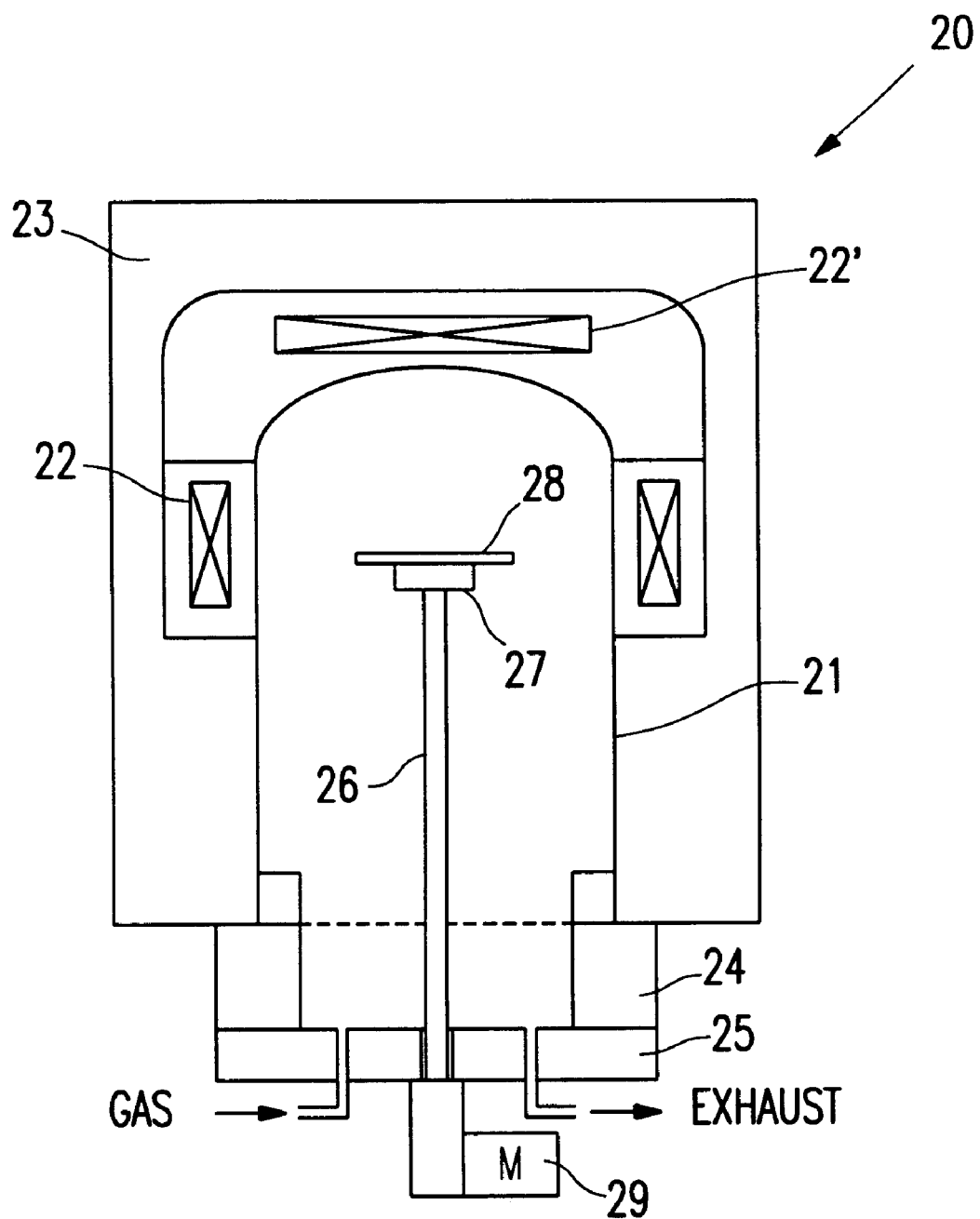
FIG. 4 is a schematic view showing the apparatus for rapid heating/rapid cooling used in the present invention.

A heat-treatment furnace 20 shown in FIG. 4 includes a bell jar 21 which is formed from, for example, silicon carbide or quarts and in which a wafer is heat-treated. Heaters 22 and 22' surround the bell jar 21 so as to heat the bell jar 21. The heater 22' is separated from the heater 22 along a vertical direction. Also, power supplied to the heater 22' is independent of that to the heater 22 for independent power control between the heaters 22 and 22'. The heating method is not limited thereto, but so-called radiation heating and induction heating may also be applicable. The bell jar 21 and the heaters 22 and 22' are housed in a housing 23 serving as a heat shield.

A water-cooled chamber 24 and a base plate 25 are arranged at the lower portion of a furnace so as to isolate the interior of the bell jar 21 from the atmosphere. A wafer 28 is held on a stage 27, which is attached to the top end of a support shaft 26, which, in turn, is moved vertically by means of a motor 29. In order to load a wafer into or unload from the furnace along a horizontal direction, the water-cooled chamber 24 has an unillustrated wafer port which is opened and closed by means of a gate valve. A gas inlet and a gas outlet are provided in the base plate 25 so that the gas atmosphere within the furnace can be adjusted.

In the heat treatment furnace 20 having the above-described structure, heat treatment for rapid heating/rapid cooling of a silicon wafer is carried out in the procedure described below.

First, the interior of the bell jar 21 is heated to a desired temperature of 900° C. to a melting point of silicon by the heaters 22 and 22' and is then held at the desired temperature. Through mutually independent control on power supplied to the heaters 22 and 22', a temperature distribution can be established within the bell jar 21 along a vertical direction. Accordingly, the heat-treatment temperature of a wafer is determined by the position of the stage 27, i.e. the amount of insertion of the support shaft 26 into the furnace. The heat treatment is performed in an atmosphere of oxygen, hydrogen, argon or a mixed atmosphere thereof.

In a state in which the interior of the bell jar 21 is maintained at a desired temperature, a wafer is inserted into the water-cooled chamber 24 through the wafer port by an unillustrated wafer handling apparatus arranged next to the heat treatment furnace 20. The inserted wafer is placed in, for example, a SiC boat provided on the stage 27 which is situated at the bottom standby position. Since the water-cooled chamber 24 and the base plate 25 are water-cooled, the wafer located at this standby position is not heated to a high temperature.

Upon completion of placing the wafer on the stage 27, the motor 29 is immediately driven to insert the support shaft 26 into the furnace so that the stage 27 is raised to a shaft 26 into the furnace so that the stage 27 is raised to a heat treatment position where a desired temperature in the range of 900° C. to a melting point of silicon is established, thereby heat-treating the wafer at the temperature. In this case, since only approximately 20 seconds, for example, is required for moving the stage 27 from the bottom standby position in the wafer-cooled chamber 24 to the heat treatment position, the silicon wafer is heated quickly.

The stage 27 is halted at the desired temperature position for a predetermined time (few seconds to few hundreds second), thereby subjecting the wafer to high-temperature heat treatment over the halting time. Upon elapse of the predetermined time to complete high-temperature heat treatment, the motor 29 is immediately driven to withdraw the support shaft 26 from the interior of the furnace to thereby lower the stage 27 to the bottom standby position in the water-cooled chamber 24. This lowering motion can be completed in approximately 20 seconds, for example. The wafer on the stage 27 is quickly cooled, since the water-cooled chamber 24 and the base plate 25 are water-cooled. Finally, the wafer is unloaded from inside the water-cooled chamber 24 by the wafer handling apparatus, thus completing the heat treatment. When there is another wafer to be subjected to the heat treatment, it can be put in the apparatus to be treated continuously, since the temperature of the heat treatment apparatus 20 is not decreased.

EXAMPLE

The following examples are being submitted to further explain specific embodiment of the present invention. These examples are not intended to limit the scope of the present invention.

Example 1

A silicon single crystal was grown through use of the crystal pulling apparatus 30 of FIG. 3. Polycrystalllne material of silicon was charged into a quartz crucible having a diameter of 18 inches. A single crystal ingot of p-type having a diameter of 6 inches and orientation <100>was pulled at a magnetic field intensity of 3000 G, at a number of rotation of a crucible of 4 rpm and at a number of rotation of crystal of 15 rpm with varying a pulling rate over the range of 0.57 to 0.50 mm/min.

The temperature of a silicon melt was 1420° C. An annular solid-liquid interface insulator having a height of 10 cm was disposed above the melt surface such that a gap of 4 cm was formed between the melt surface and the bottom end of the interface insulator. Through adjustment of a crucible-holding shaft, the height of a ceiling of a pull chamber was adjusted to 30 cm above the melt surface. An upper surrounding insulator was disposed on the interface insulator.

A doping amount of nitrogen was $1\times10^{13}$ atoms/cm$^3$. Oxygen concentration was 7 to 10 ppma (JEIDA). The pulling was performed while the F/G value at the center of the crystal varied within the range of 0.161 to 0.141 mm$^2$/° C.· min.

Wafers were sliced from the thus obtained single crystal ingot. The wafers were mirror-polished, yielding single-crystal mirror wafers of silicon. The thus obtained mirror wafers were measured in order to determine the grown-in defects (FPD, LEP (LSEP, LFPD)). Further, thermal oxidation treatment was performed in order to confirm the presence/absence of an OSF ring.

As a result, neither grown-in defect nor OSF ring was observed.

Then, oxide dielectric breakdown voltage characteristics of the wafer was evaluated.

First, C-mode yield of TZDB was determined by manufacturing a phosphorus doped polysilicon electrode (thickness of the oxide film: 25 nm, electrode area: 8 mm$^2$), and evaluating at electric current density in decision of 1 mA/cm$^2$. The wafer having dielectric breakdown electric field of 8 MV/cm or more is defined as a good chip.

γ-mode yield of TDDB was also evaluated. It was conducted with the above-mentioned phosphorus doped polysilicon electrode and sending stress electric current of 0.01 mA/cm$^2$. The wafer wherein dielectric breakdown occurs at a charge amount of 25 C/cm$^2$ or more was evaluated to be a good chip.

A good chip yield of TZDB was 100% on average, and that of TDDB was 94% on average. Accordingly, the silicon wafer of the present invention was excellent in oxide dielectric breakdown characteristics. When it is used for fabrication of a device, characteristics of the device and yield thereof will be improved.

Comparative Example 1

The silicon single crystal ingot was pulled in the same method as Example 1 except that nitrogen was not doped and the pulling rate was 0.54 to 0.52 mm/min (F/G:0.152 to 0.146 mm$^2$/° C.·min). Presence of grown-in defects and OSF ring was determined in the same manner as Example 1.

Grown-in defects and OSF ring were observed in some wafer sliced from certain parts of the single crystal ingot. It shows that N-region where OSF was not present was quite narrow, and it was difficult to produce the wafer having N-region in the entire surface.

Example 2

The silicon single crystal ingot was pulled in the same method as Example 1 except that oxygen concentration was 14 ppma (JEIDA). Wafers were sliced from the thus obtained single crystal ingot, and subjected to a heat treatment of 800° C.×4 hours+1000° C.×16 hours. A density of defects in the wafer after the heat treatment was measured.

The defect density was measured with OPP (Optical Precipitate Profiler manufactured by Bio-Rad).

The result was $5\times10^9$ to $7\times10^{10}$ number/cm$^3$, which was higher than a conventional silicon wafer, and shows higher gettering effect of the wafer.

Comparative Example 2

The silicon single crystal ingot was pulled in the same method as Example 2 except that nitrogen was not doped, and oxygen concentration was 14 ppma (JEIDA). Wafers were sliced from the thus obtained single crystal ingot, and subjected to a heat treatment of 800° C.×4 hours+1000° C.×16 hours. The defect density after the heat treatment was measured with OPP in the same manner as Example 2.

The density was low as $5\times10^7$ to $2\times10^8$ number/cm$^3$. The reason can be considered as follows. Oxygen precipitation is not accelerated when nitrogen is not doped. Particularly, density of crystal defects is low in N (I) region of the wafer where gettering effect is low, so that a density of crystal defects in the entire wafer is also low.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon single crystal having a diameter of 6 inches was grown. However, the present invention can be applied to a method of pulling a crystal recently produced having larger diameter, for example, 8 to 16 inches, or more.

What is claimed is:

1. A method for producing a silicon single crystal wafer wherein the silicon single crystal is grown by Czochralski method with doping nitrogen so that the entire surface of the crystal may become a N-region.

2. The method for producing a silicon single crystal wafer according to claim 1 wherein a magnetic field is applied thereto when a crystal is grown by Czochralski method.

3. The method for producing a silicon single crystal wafer according to claim 1 wherein a concentration of doped nitrogen is $5\times10^{11}$ atoms/cm$^3$ to $5\times10^{14}$ atoms/cm$^3$.

4. The method for producing a silicon single crystal wafer wherein nitrogen on the surface of the silicon single crystal wafer obtained by the method of claim 1 is out-diffused by a heat treatment.

5. The method for producing a silicon single crystal wafer according to claim 4 wherein the heat treatment is conducted with a rapid heating/rapid cooling apparatus.

6. A method for producing a silicon single crystal wafer wherein a silicon single crystal is grown in accordance with the CZ method with doping nitrogen in an N-region in a defect distribution chart which shows a defect distribution in which the horizontal axis represents a radial distance D (mm) from the center of the crystal and the vertical axis represent a value of F/G (mm$^2$/° C.·min), where F is a pulling rate (mm/min) of the single crystal, and G is an average intra-crystal temperature gradient (° C./mm) along the pulling direction within a temperature range of the melting point of silicon to 1400° C.

7. The method for producing a silicon single crystal wafer according to claim 6 wherein a magnetic field is applied thereto when a crystal is grown by Czochralski method.

8. The method for producing a silicon single crystal wafer according to claim 6 wherein a concentration of doped nitrogen is $5 \times 10^{11}$ atoms/cm$^3$ to $5 \times 10^{14}$ atoms/cm$^3$.

9. The method for producing a silicon single crystal wafer wherein nitrogen on the surface of the silicon single crystal wafer obtained by the method of claim 6 is out-diffused by a heat treatment.

10. The method for producing a silicon single crystal wafer according to claim 9 wherein the heat treatment is conducted with a rapid heating/rapid cooling apparatus.

* * * * *